(12) United States Patent
van Veldhoven et al.

(10) Patent No.: US 11,658,620 B2
(45) Date of Patent: May 23, 2023

(54) DIGITAL SIGNAL GENERATOR FOR AUDIO ARTEFACT REDUCTION

(71) Applicant: NXP B.V., Eindhoven (NL)

(72) Inventors: Robert van Veldhoven, Valkenswaard (NL); Khalid Mabtoul, Roermond (NL); Dmitrij Andreevits Sjwed, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/459,050

(22) Filed: Aug. 27, 2021

(65) Prior Publication Data
US 2022/0123696 A1 Apr. 21, 2022

(30) Foreign Application Priority Data
Oct. 20, 2020 (EP) .................................... 20202892

(51) Int. Cl.
*H03F 3/181* (2006.01)

(52) U.S. Cl.
CPC ......... *H03F 3/181* (2013.01); *H03F 2200/03* (2013.01); *H03F 2200/264* (2013.01)

(58) Field of Classification Search
CPC ................. H03F 3/181; H03F 2200/03; H03F 2200/264; H03F 1/26; H03F 3/187; H03G 5/165; H03G 3/3026; H03G 3/348
USPC ........................................................ 381/120
See application file for complete search history.

(56) References Cited

U.S. PATENT DOCUMENTS

| | | | |
|---|---|---|---|
| 4,205,383 A * | 5/1980 | Bakanovich | G06F 30/20 703/3 |
| 5,394,476 A | 2/1995 | Rollins et al. | |
| 8,525,589 B2 | 9/2013 | Doi | |
| 8,394,476 B2 | 12/2013 | Hama et al. | |
| 9,401,721 B1 * | 7/2016 | Barakat | H04L 7/033 |
| 2006/0044065 A1 * | 3/2006 | Ishida | H03G 3/3026 330/279 |

(Continued)

OTHER PUBLICATIONS

Sodagar, A., "A Pipelined ROM-Less Architecture for Sine-Output Direct Digital Frequency Synthesizers Using the Second-Order Parabolic Approximation", IEEE Transactions on Circuits and Systems—II: Analog and Digital Signal Processing, vol. 48, No. 9, Sep. 2001.

*Primary Examiner* — Jason R Kurr
*Assistant Examiner* — Friedrich Fahnert

(57) ABSTRACT

A digital signal generator apparatus and method is described. The digital signal generator includes a counter, an integrator and a comparator. The counter counts up or down from an initial counter value dependent on a counter control input. The comparator has a first input coupled to the counter output, a threshold input and a comparator output coupled to the counter control input. The integrator has an input coupled to the counter output and an output coupled to the digital signal generator output. The digital signal generator determines the count direction after the initial direction dependent on the comparison between a threshold value applied to the threshold input and the counter output value. The digital signal generator may implement the generation of a waveform having an approximation to a raised cosine function. The generated waveform may be used for audio artefact reduction in an audio amplifier during mute or unmute operations or during power up power down operations.

16 Claims, 5 Drawing Sheets

(56) References Cited

U.S. PATENT DOCUMENTS

| | | | |
|---|---|---|---|
| 2006/0164277 A1* | 7/2006 | Lee | H03K 4/50 341/155 |
| 2007/0228835 A1* | 10/2007 | Varzhabedian | H02J 7/02 307/66 |
| 2009/0231035 A1* | 9/2009 | Tseng | H03F 3/2173 330/10 |
| 2010/0259330 A1 | 10/2010 | Nakai et al. | |
| 2015/0071464 A1* | 3/2015 | Du | H03F 3/2171 381/94.5 |
| 2015/0288335 A1* | 10/2015 | Høyerby | H03F 1/0205 330/251 |
| 2017/0288619 A1 | 10/2017 | Lesso | |
| 2018/0226926 A1* | 8/2018 | Miyake | H03F 3/2171 |

\* cited by examiner

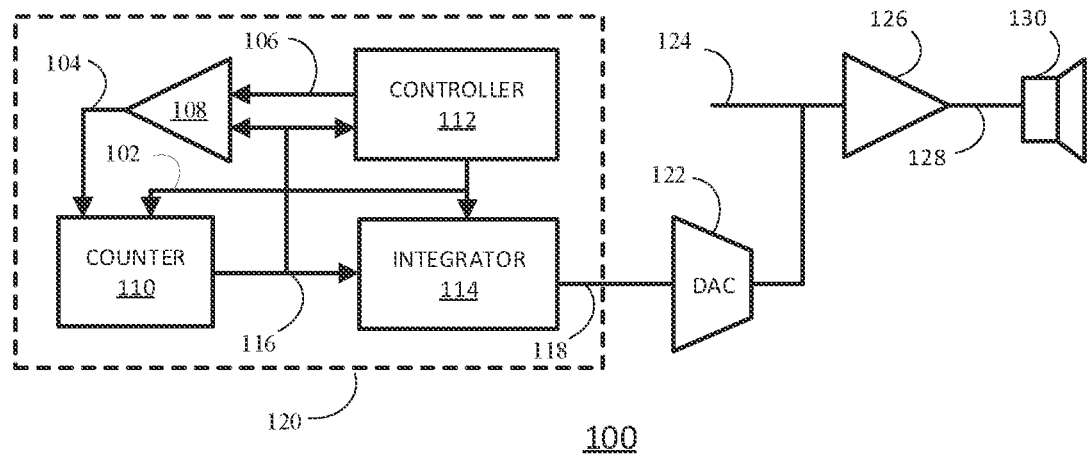
FIG. 1
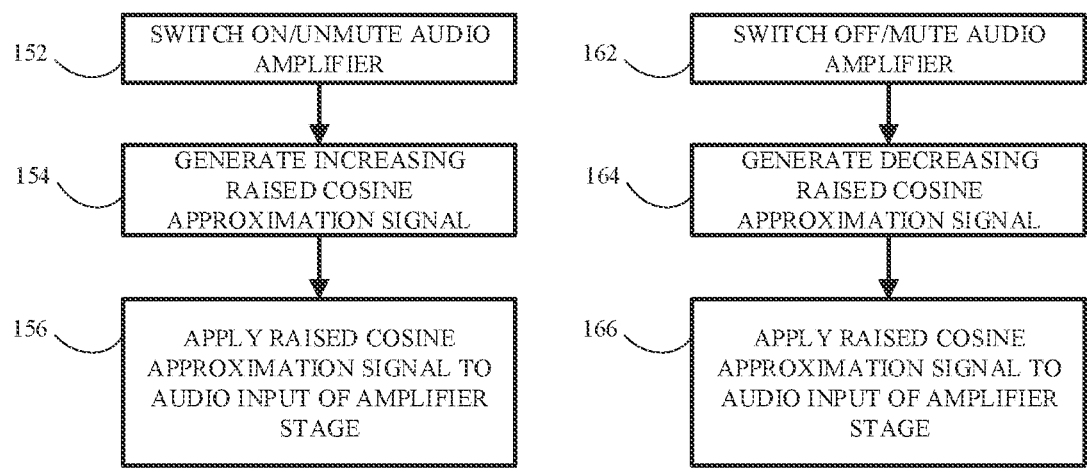
FIG. 2A
FIG. 2B

260

270

DIGITAL SIGNAL GENERATOR FOR AUDIO ARTEFACT REDUCTION

CROSS-REFERENCE TO RELATED APPLICATIONS

This application claims the priority under 35 U.S.C. § 119 of European Patent application no. 20202892.4, filed on 20 Oct. 2020, the contents of which are incorporated by reference herein.

FIELD

This disclosure relates to a digital signal generator for audio artefact reduction in audio amplifiers.

BACKGROUND

Audio amplifiers may produce audio artefacts such as audible pops and clicks. These artefacts may occur for example when an audio amplifier is being switched on or off or as a result of a mute or unmute operation. To reduce such audio artefacts the voltage applied to the amplifier may be gradually increased or decreased when powering up or down an amplifier or executing a mute/unmute operation.

SUMMARY

Various aspects of the disclosure are defined in the accompanying claims. In a first aspect there is provided a digital signal generator for audio artefact reduction in an audio amplifier, the digital signal generator comprising: a counter having a counter output and configured to count up or down from an initial counter value dependent on a counter control input; a comparator having a first comparator input coupled to the counter output, a second comparator input and a comparator output coupled to the counter control input; wherein the digital signal generator is configured to determine the count direction after the initial count direction dependent on the comparison between a threshold value applied to the second comparator input and the counter output value; and an integrator having an integrator input coupled to the counter output and an integrator output coupled to the digital signal generator output.

In one or more embodiments, the digital signal generator may be further configured to count up to the threshold value from the initial counter value and then count down to the initial counter value.

In one or more embodiments, the digital signal generator may be further configured to count down to the threshold value from the initial counter value and then count up to the initial counter value.

In one or more embodiments, the digital signal generator may further comprise a reset input coupled to the integrator and the counter, and a preset value input coupled to the counter, wherein the initial counter value is determined by the reset value and a counter step size is determined by the preset value.

In one or more embodiments, the integrator may further comprise a summing module, a delay element and a gain module wherein a first summing module input is coupled to the counter output, a second summing module input is coupled to the delay element output, the summing module output is coupled to the gain module input and the gain module output is coupled to the integrator output.

In one or more embodiments, the duration of the digital signal may be dependent on at least one of the clock frequency of the counter and the counter step size.

In one or more embodiments, the amplitude of the digital signal generator output may be dependent on the gain of the gain module.

In one or more embodiments, the counter output may correspond to a triangle waveform and the digital signal generator output may correspond to an approximation of a raised cosine waveform.

In one or more embodiments, the digital signal generator of any preceding claim may comprise a controller having an input coupled to an output of the counter, a first control output coupled to the threshold input, a second control output coupled to the reset input and a third control output coupled to the preset input.

In one or more embodiments, the digital signal generator may be included in an audio amplifier system. The digital signal generator output may be coupled to an audio input of an amplifier stage of the audio amplifier system.

In one or more embodiments, the digital signal generator may be configured to generate a digital signal in response to switching the amplifier stage between an off-state and an on-state.

In one or more embodiments, the digital signal generator may be configured to generate a digital signal in response to switching between a mute state and an un-mute state of the audio amplifier.

In a second aspect there is provided a method of digital signal generation for audio artefact reduction in an audio amplifier, the method comprising: providing a digital counter configured to count up or down in an initial count direction from an initial value; comparing the counter output with a threshold value to determine the direction of the count after the initial count direction; providing an integrator to integrate the counter output; providing a digital signal output from the output of the integrator.

In one or more embodiments, the method may further comprise applying the digital signal to an amplifier stage of the audio amplifier in response to switching the amplifier stage between an off-state and an on-state.

In one or more embodiments, the method may further comprise applying the digital signal to an amplifier stage of the audio amplifier in response to switching the amplifier stage between a mute state and an un-mute state of the audio amplifier.

In one or more embodiments, the counter output may corresponds to a triangle or sawtooth waveform.

In a third aspect, there is provided a non-transitory computer readable media comprising a computer program comprising computer executable instructions which, when executed by a computer, causes the computer to perform a method for audio artefact reduction in an audio amplifier, the method comprising the steps of counting up or down in an initial count direction from an initial value; comparing the counter output with a threshold value to determine the direction of the count after the initial count direction; providing an integrator to integrate the counter output; and providing a digital signal output from the output of the integrator.

In one or more embodiments, the non-transitory computer readable media may further comprise computer executable instructions to perform the steps of applying the digital signal to an amplifier stage of the audio amplifier in response to switching the amplifier stage between an off-state and an on-state.

In one or more embodiments, the non-transitory computer readable media may further comprise computer executable instructions to perform the steps of applying the digital signal to an amplifier stage of the audio amplifier in response to switching the amplifier stage between a mute state and an un-mute state of the audio amplifier.

BRIEF DESCRIPTION OF THE DRAWINGS

In the figures and description like reference numerals refer to like features. Embodiments are now described in detail by way of example only, illustrated by the accompanying drawings in which:

FIG. 1 shows an audio amplifier system including a digital signal generator according to an embodiment.

FIG. 2A illustrates a method of operation of the audio amplifier system of FIG. 1.

FIG. 2B illustrates a method of operation of the audio amplifier system of FIG. 1.

DETAILED DESCRIPTION OF EMBODIMENTS

Figure 3A:
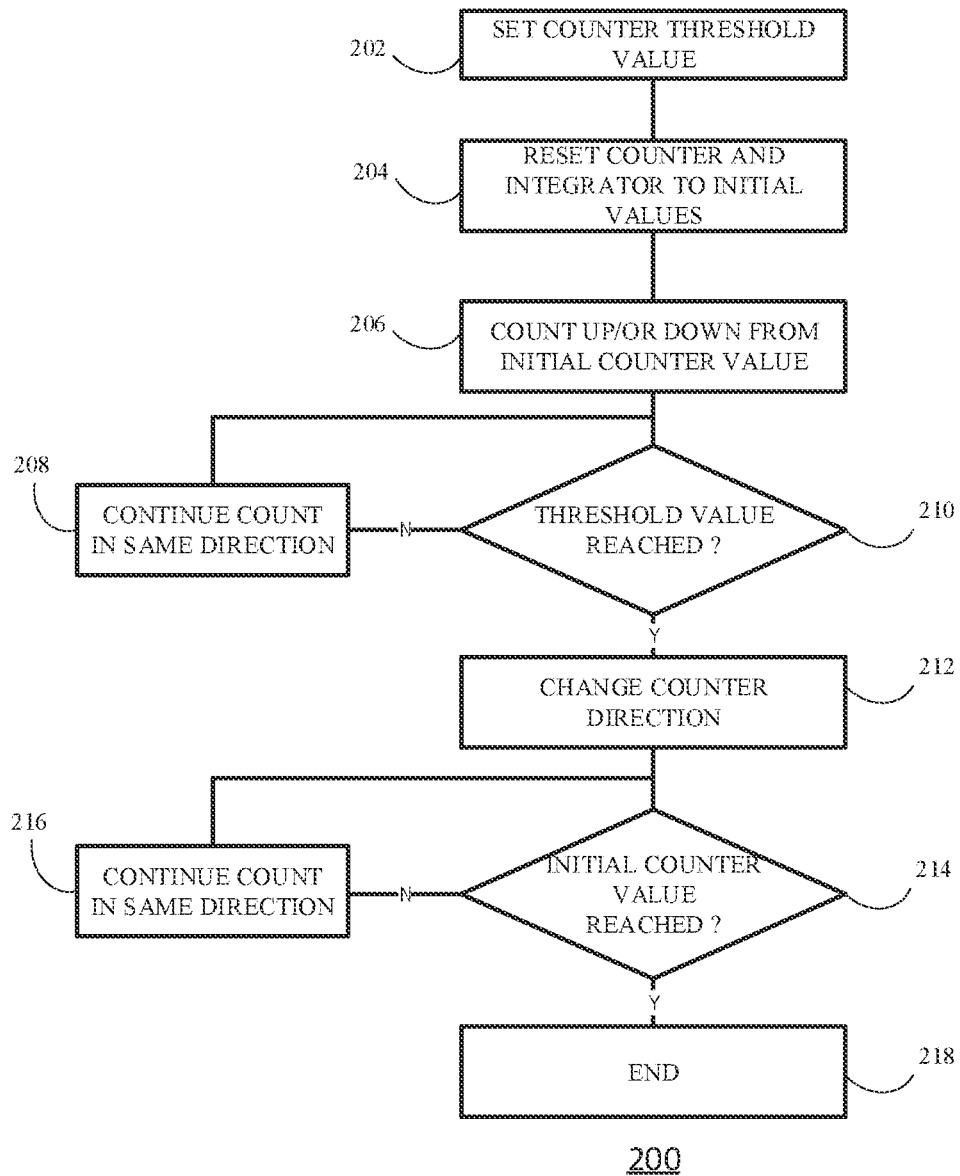
FIG. 3A shows a method of generating an approximation of a raised cosine signal for audio artefact reduction using the digital signal generator of FIG. 1.

FIG. 1 shows an audio amplifier system 100 including a digital signal generator 120 according, to an embodiment. The audio amplifier system 100 may also include a digital-to-analog converter (DAC) 122, an amplifier stage 126 which may be for example a class A, a class AB, or a class D amplifier, and a loudspeaker 130.

The digital signal generator 120 may include a controller 112, an integrator 114, a counter module 110, and a comparator 108. The controller 112 may have a reset output 102 coupled to the counter module 110 and the integrator 114. The controller 112 may have an input connected to the counter output 116. The counter output 116 may be connected to a first input of the comparator 108 and an input of the integrator 114. The controller 112 may have a threshold value output 106 connected to a second input of the comparator 108. The comparator output 104 may be connected to an up down control input of the counter module 110. The output of the integrator 114 may be connected to the digital signal generator output 118. The digital signal 120 may be implemented entirely using hardware digital logic gates. In other examples, one or more of the counter module 110, the integrator 114, the controller 112, and the comparator 108 may be implemented as software running on a microprocessor.

In operation the digital signal generator output 118 may be connected to the input of the DAC 122. If the amplifier stage 126 is a digital amplifier or has a digital amplifier input, then the DAC 122 may be omitted. The amplifier stage 126 may have an audio input 124 which is connected to the output of the DAC 122. The amplifier stage output 128 may be connected to a loudspeaker 130.

FIG. 2A shows an example method of operation 150 of the audio amplifier system 100. In step 152 the audio amplifier 100 may be switched on or unmuted. In step 154 the digital signal generator 120 may generate an increasing raised cosine approximation signal. In step 156 the raised cosine approximation signal may be applied to the audio input of the amplifier stage 126. Following step 156, the audio amplifier stage 126 may then receive a wanted audio signal on the audio input 124. As illustrated in FIG. 1, the connection from the DAC output is directly to the audio input 124. In other embodiments inhere the amplifier stage 126 is a digital amplifier, the DAC 122 may be omitted and the digital signal generator output 118 may be digitally combined with the audio input 124 for example with a multiplexer or other digital logic.

FIG. 2B shows an example method of operation 160 of the audio amplifier system 100. In step 162 the audio amplifier 100 may be switched off or muted. In step 164 the digital signal generator 120 may generate a decreasing raised cosine approximation signal. In step 166 the raised cosine approximation signal may be applied to the audio input of the amplifier stage 126.

FIG. 3A shows a method 200 of generating an approximated raised cosine signal which may be increasing or decreasing. The method 200 may be implemented for example using the digital signal generator 120. In step 202 a counter threshold value may be set for example by the controller 112 setting a value on the threshold value output 106. In step 204 the counter 110 and the integrator 114 may be reset to respective initial values by the controller 112. In some examples the order of steps 202 and 204 may be reversed. The integrator reset value may be set to determine a DC voltage level. The counter reset value may for example be zero but could be some other value. In step 206 the counter 110 may count up or down from the initial counter value determined by the reset. The initial counter direction may be determined depending on whether an increasing raised cosine approximation is required or decreasing raised cosine approximation is required. For an increasing raised cosine approximation, the counter will initially count up and for a decreasing raised cosine approximation, the counter 110 will initially count down. After step 206 the method proceeds to step 210 where a comparison between the threshold value and the counter value is made. In digital signal generator 120, this may be done for example by the comparator 108 comparing the threshold value set by the controller 112 with the current counter value on the counter output 116. If the threshold value has not been reached, the method proceeds to step 208 and the counter continues counting in the same direction as previously set. The method then returns to 210 to repeat the check against the threshold value. If the threshold value has been reached then the method proceeds to 212 and the direction of the count is changed. Method 200 then proceeds to step 214 where a check is made as to whether the initial counter value set in step 204 has been reached. If the initial counter value has not been reached then the method proceeds to step 216 and the count continues in the same direction. Following from step 216 the method then returns to the check at 214. If the initial counter value has been reached in step 214, the method proceeds to step 218 and the process ends.

Figure 3B:
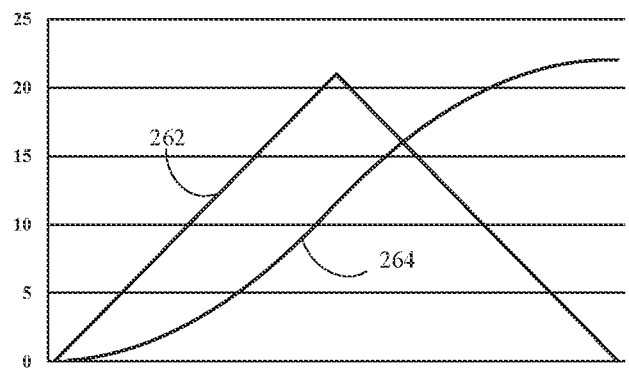
FIG. 3B shows an example increasing approximated cosine waveform generated by the digital signal generator of FIG. 1 using the method of FIG. 3A

FIG. 3B shows a graph 260 of counter value on the y-axis versus time on the x-axis. Graph 260 illustrates an example of the counter output value 262 and the integrator output 264 output of the digital signal generator 120 when implementing method 200 to generate an increasing cosine approximation signal. The counter 120 outputs a sawtooth or triangle waveform which increases to the threshold value from an initial counter value and then decreases from the threshold value to the initial value. The integral of this waveform by the integrator 114 gives an increasing approximation to a raised cosine.

Figure 3C:
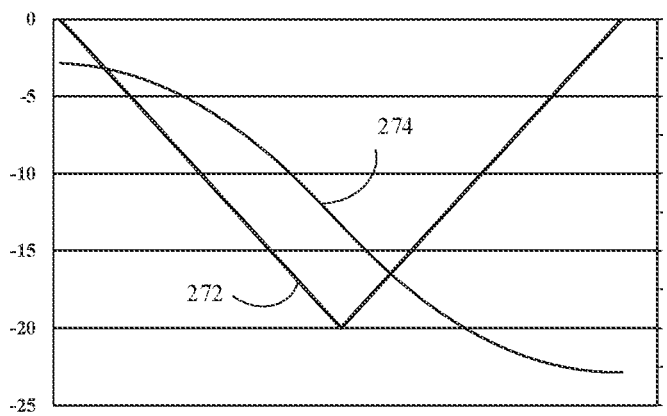
FIG. 3C shows an example decreasing approximated cosine waveform generated using the method of FIG. 3A

FIG. 3C shows a graph 270 of counter value on the y-axis versus time on the x-axis. Graph 270 illustrates an example of the counter output value 272 and the integrator output 274 output of the digital signal generator 120 when implementing method 200 to generate a decreasing cosine approximation signal. The counter 120 outputs a sawtooth waveform which decreases to the threshold value from an initial value and then increases from the threshold value to the initial value. The integral of this waveform by the integrator 114 gives an increasing approximation to a raised cosine.

To enable a raised cosine (or cosine in general) a look-up table (memory) is normally required. The size of this memory is dependent on the resolution required. To reduce the memory size, interpolation between subsequent points is possible, but that will either limit accuracy or needs higher order interpolation which means a lot of hardware may be required.

The inventors of the present disclosure have appreciated that an approximate the raised cosine function may be implemented efficiently in digital logic by a combination of $a(x-b)^2+c$ functions from here on referred to as an approximation. In the first half of the approximated raised cosine a is positive, in the second half of the raised cosine a is negative. The coefficients b and c are chosen such that the two curve halves fit together exactly, thereby ensuring that the curve is continuous. The derivative of $a(x-b)^2+c$ is $y=2ax-2ba$, a and b being dependent on the region of operandi. Therefore, the derivative of the approximation looks like a triangle wave. Consequently by using a counter 110 and an integrator 114, the digital signal generator 120 can generate an approximated cosine which may give improved audio artefact reduction due to clicks and pops compared to a simple linear slope starting at an equivalent to zero volts DC (or other DC value) for example.

Figure 4A:
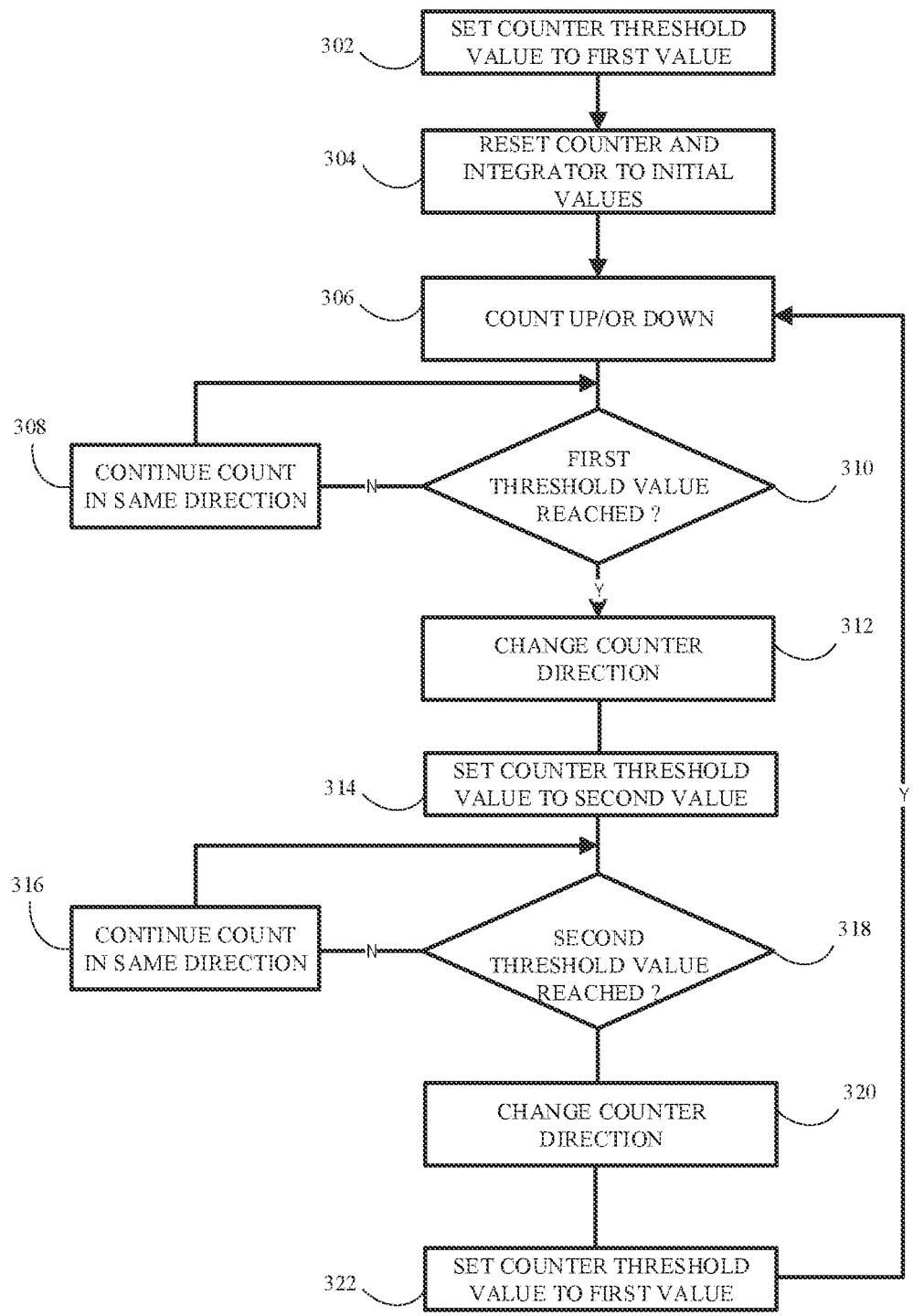
FIG. 4A shows a method of generating an approximation a raised cosine signal using the digital signal generator of FIG. 1.

FIG. 4A shows a method of generating a continuous approximated raised cosine signal 300 for example using the digital signal generator 120. In step 302 a counter threshold value may be set by the controller 112. In step 304 the counter 110 and the integrator 114 may be set to respective initial values. In some examples the order of steps 302 and 304 may be reversed. The initial value of the counter 110 and the integrator 114 may be the same or different. In step 306 the counter may start counting in initial direction up or down. The method then proceeds to step 310 and a check is made to see if the first threshold value has been reached. This check may be done in digital signal generator 120 by the comparator 108 comparing the counter output 116 with the threshold value output 106. If the first threshold value has not been reached then the method proceeds to step 308 and the count continues in the same direction following which the method then returns to step 310. Once the first threshold value has been reached, the method proceeds to step 312 and the counter direction is changed. Following the change of direction in step 314 a second threshold value is set. This may be done for example by the controller 112 setting a second threshold value on the threshold value output 106. The method then proceeds to step 318 where a check is made to see if the second threshold value has been reached. If the second threshold value has not been reached, in step 316 the counter will continue counting in the same direction as previously defined. The method then returns to step 318. Once the second threshold value has been reached. The method 300 proceeds to step 320 and the counter direction is changed again. In step 322 the controller 112 may set the counter threshold value back to the first value. The method then proceeds to 306 where the counter 110 counts up or down, the direction being determined by the current counter direction value and the cycle repeats.

Figure 4B:
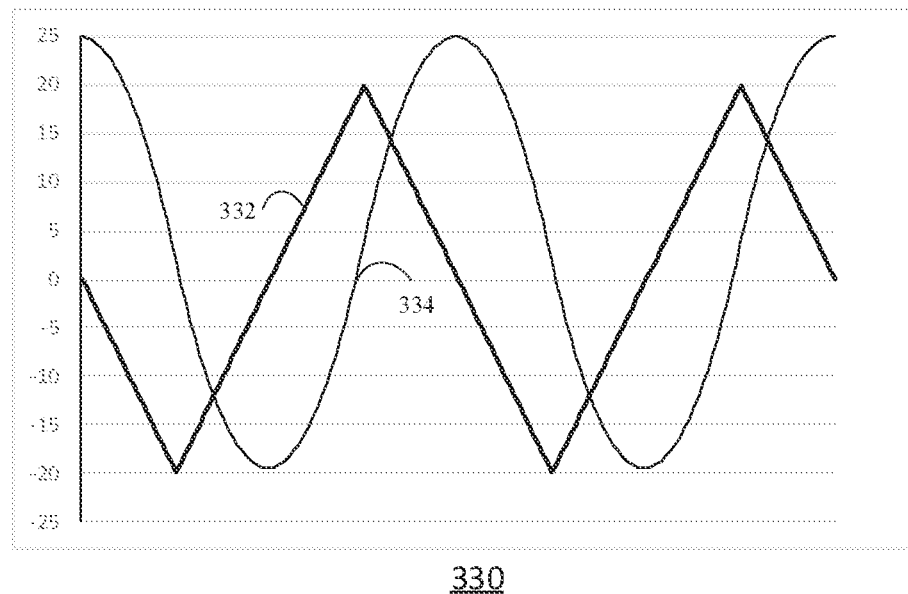
FIG. 4B shows an example approximated cosine waveform generated using the method of FIG. 4A.

FIG. 4B shows a graph 330 of counter value on the y-axis versus time on the x-axis. Graph 330 illustrates an example of the waveform generated using the method 300. Waveform 332 shows the output of the counter which is generating a continuous triangle wave. Waveform 334 corresponds the output of the integrator 114 which generates an approximation to a raised cosine wave by integrating the counter output.

Figure 5:
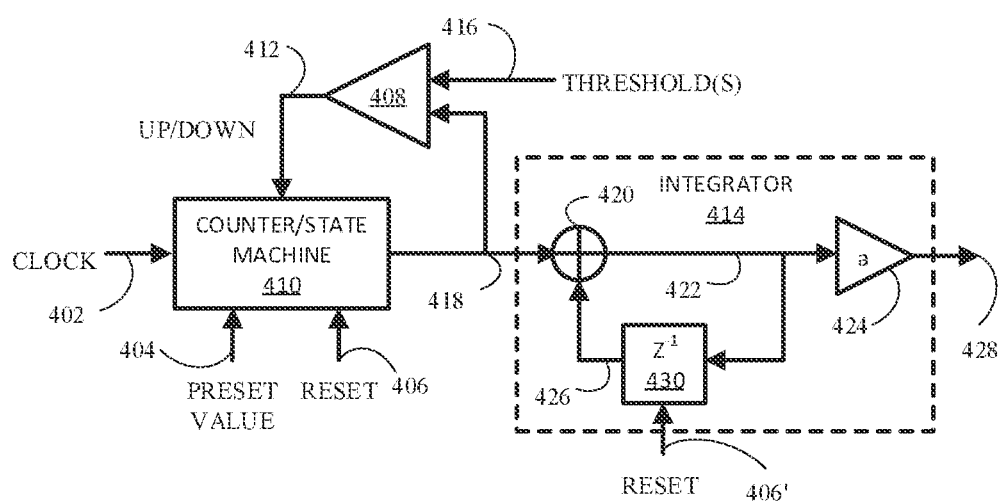
FIG. 5 shows a digital signal generator according to an embodiment.

FIG. 5 shows a digital signal generator 400 according to an embodiment. The digital signal generator 400 may be implemented using digital logic hardware and may be used to implement the methods 200 and 300 for example. The digital signal generator 400 includes a counter 410, a comparator 408 and an integrator 414. The integrator 414 includes a summing module 420, a delay element 430, and a gain module 424.

The counter 410 may be configured to count up or down and may also include some control logic implemented as the state machine. The counter may have a clock input 402 a preset value input 404 which may be used for example to determine the counter step size S. The counter 410 may also have a reset input 406 and an up-down control input 412. The counter output 418 may also be connected to a first input of a comparator 408. A second input 416 of the comparator 408 may receive a threshold value from a controller (not shown). The comparator output many be connected to the up-down control input 412. The counter output 418 may be connected to a first input of the summing module 420. The second input of the summing module 420 may be connected to a output 426 of the delay element 430. The summing module output 422 may be connected to an input of the delay element 430 and an input of the gain module 424. The output of the gain module 424 may be connected to the signal generator output 428. A reset input 406' may be connected to the delay element 430. The delay element 430 which may be a hardware register may also be connected to the clock input 402 (not shown).

In operation, the digital signal generator 400 may generate an increasing cosine approximation shown in graph 260 in a similar way to method 200. At reset, which may be determined by a controller (not shown) connected to the reset input 406 the output of the counter may be set to zero. The up-down control input 412 may for example be logic high indicating an UP count direction, and the integrator start value may be set. After reset, each clock cycle the output of the counter 410 is increased by S, the step size of the counter, which is determined by the preset value input 404. At a certain threshold determined by the threshold value, the comparator output 412 becomes logic low and so the counter 410 changes to counting down, and the output of the counter is then reduced by S every clock cycle, until it reaches 0 and will stop. The integrator output corresponding to the digital signal generator output 428 will be the integral of the triangle wave generated by the counter 410, which, as previously described, will approximate a raised cosine waveform.

The approximated raised cosine length and amplitude can be varied by changing the clock frequency of the clock applied to the counter, and the counter step value. The approximated raised cosine amplitude can be varied by varying the gain of the gain module 424. The final amplitude may be set to typically half of the supply voltage so that the wanted audio signal can have maximum voltage swing in either direction.

The digital signal generator may also use a second threshold value similarly to as described in method 300, to generate a repeating triangle waveform. To be able to reconstruct a full sine wave, the counter 410 may need to be able to count lower than 0. In alternative examples, after the counter 410 the correct DC value may be subtracted, to avoid run-away of the integrator 414. Subsequently, a continuous cosine wave can be generated with minor adaptations.

The digital signal generator 400 allows the approximations of a cosine or raised cosine to be created using very simple hardware. In contrast to digitally generate a raised cosine (or cosine in general) a look-up table (memory) is normally required. The size of this memory is dependent on the resolution required. To reduce the memory size, interpolation between subsequent points is possible, but that will either limit accuracy or needs higher order interpolation which means a lot of hardware as well.

The digital signal generator 400 may be used instead of digital signal generator 120 in audio amplifier system 100 to reduce audio artefacts. Using an approximated raised cosine during mute/unmute or power up/down operations may reduce audio artefacts compared to using a linear ramp, since The transition from DC (often 0) to the linear ramp creates a big discontinuity in the derivative, and therefore more spectral content, leading to audible plops.

A specific application of the approximated cosine function is found in a raised cosine start-up in audio amplifiers. Switching the amplifier from off to on state, often causes audible plops at the speaker. To reduce the audio pops, smoother transitions between switching off and on may be used. Embodiments of the digital signal generator generate an approximation to a raised cosine which has no discontinuities, as the cosine at 0 and pi has a derivative of zero. Therefore, spectral content is less, and audible plops are greatly reduced. The approximated cosine generated by the digital signal generators and methods described may give comparable audio artefact reduction performance to a true raised cosine signal but with a significantly reduced area when implemented in hardware logic.

A digital signal generator apparatus and method is described. The digital signal generator includes a counter, an integrator and a comparator. The counter counts up or down from an initial counter value dependent on a counter control input. The comparator has a first input coupled to the counter output, a threshold input and a comparator output coupled to the counter control input. The integrator has an input coupled to the counter output and an output coupled to the digital signal generator output. The digital signal generator determines the count direction after the initial direction dependent on the comparison between a threshold value applied to the threshold input and the counter output value. The digital signal generator may implement the generation of a waveform having an approximation to a raised cosine function. The generated waveform may be used for audio artefact reduction in an audio amplifier during mute or unmute operations or during power up power down operations.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A digital signal generator for audio artefact reduction in an audio amplifier, the digital signal generator comprising:
   a counter having a counter output and configured to:
      count up or down in an initial count direction from an initial counter value dependent on a counter control input; and
      count up to a threshold value from the initial counter value and then count down to the initial counter value;
   a comparator having a first comparator input coupled to the counter output, a second comparator input, and a comparator output coupled to the counter control input; wherein
   the digital signal generator is configured to determine the count direction after the initial count direction dependent on the comparison between a threshold value applied to the second comparator input and the counter output value;
   an integrator having an integrator input coupled to the counter output and an integrator output coupled to the digital signal generator output;
   a reset input coupled to the integrator and the counter; and
   a preset input coupled to the counter, wherein the initial counter value is determined by a reset value and a counter step size is determined by a preset value.

2. The digital signal generator of claim 1 wherein the integrator further comprises a summing module, a delay element and a gain module wherein a first summing module input is coupled to the counter output, a second summing module input is coupled to a delay element output, the summing module output is coupled to a gain module input and a gain module output is coupled to the integrator output.

3. The digital signal generator of claim 2 wherein the duration of the digital signal is dependent on at least one of the clock frequency of the counter and the counter step size.

4. The digital signal generator of claim 2 wherein the amplitude of the digital signal generator output is dependent on the gain of the gain module.

5. The digital signal generator of claim 1 wherein the counter output corresponds to a triangle waveform.

6. The digital signal generator of claim 5 wherein the digital signal generator output corresponds to an approximation of a raised cosine waveform.

7. The digital signal generator of claim 1 further comprising a controller having an input coupled to an output of the counter, a first control output coupled to the threshold input, a second control output coupled to the reset input and a third control output coupled to the preset input.

8. An audio amplifier comprising the digital signal generator of claim 1 and an amplifier stage wherein the digital signal generator output is coupled to an audio input of the amplifier stage.

9. The audio amplifier of claim 8 wherein the digital signal generator is configured to generate a digital signal in response to switching the amplifier stage between an off-state and an on-state.

10. The audio amplifier of claim 8 wherein the digital signal generator is configured to generate a digital signal in response to switching between a mute state and an un-mute state of the audio amplifier.

11. A method of digital signal generation for audio artefact reduction in an audio amplifier, the method comprising:
providing a digital counter configured to count up or down in an initial count direction from an initial value;
comparing the counter output with a threshold value to determine the direction of the count after the initial count direction;
providing an integrator to integrate the counter output;
providing a digital signal output from the output of the integrator, wherein the duration of the digital signal is dependent on at least one of a clock frequency of the counter and a counter step size.

12. The method of claim 11 further comprising applying the digital signal to an amplifier stage of the audio amplifier in response to switching the amplifier stage between an off-state and an on-state.

13. The method of claim 11, wherein the digital counter is further configured to count up to the threshold value from the initial counter value and then count down to the initial counter value.

14. The method of claim 11, wherein the digital counter is further configured to count down to the threshold value from the initial counter value and then count up to the initial counter value.

15. The method of claim 11, further comprising providing a reset input coupled to the integrator and the counter, and providing a preset value input coupled to the counter, wherein the initial counter value is determined by the reset value and a counter step size is determined by the preset value.

16. The method of claim 11, wherein the integrator further comprises a summing module, a delay element and a gain module wherein a first summing module input is coupled to the counter output, a second summing module input is coupled to the delay element output, the summing module output is coupled to the gain module input and the gain module output is coupled to the integrator output.

* * * * *